United States Patent [19]
Bonham, Jr. et al.

[11] Patent Number: 5,396,032
[45] Date of Patent: Mar. 7, 1995

[54] METHOD AND APPARATUS FOR PROVIDING ELECTRICAL ACCESS TO DEVICES IN A MULTI-CHIP MODULE

[75] Inventors: Harry B. Bonham, Jr., Plano; Charles R. Pratt, III, Richardson; Bryan K. Douglas, Carrollton, all of Tex.

[73] Assignee: Alcatel Network Systems, Inc., Richardson, Tex.

[21] Appl. No.: 58,553

[22] Filed: May 4, 1993

[51] Int. Cl.⁶ ............................................. H01L 23/02
[52] U.S. Cl. ...................................... 174/52.4; 437/8
[58] Field of Search ............................ 174/52.4, 52.2; 437/207, 209, 206, 8; 29/841, 837; 257/177, 182, 666, 787

[56] References Cited

U.S. PATENT DOCUMENTS

| | | | |
|---|---|---|---|
| 4,082,394 | 4/1978 | Gedney et al. | 174/52.4 X |
| 4,167,647 | 9/1979 | Salera | 174/52.4 |
| 4,180,161 | 12/1979 | Henrickson et al. | 174/52.4 X |
| 4,331,831 | 5/1982 | Ingram et al. | 174/52.4 |
| 4,575,747 | 3/1986 | Fritz | 174/52.4 X |
| 4,701,781 | 10/1987 | Sankhagowit | 174/52.4 X |
| 4,711,024 | 12/1987 | Russell | 29/832 |
| 4,727,410 | 2/1988 | Higgins, III | 174/52.4 X |
| 4,772,936 | 9/1988 | Reding et al. | |
| 4,801,561 | 1/1989 | Sankhagowit | 437/207 |
| 4,866,508 | 9/1989 | Eichelberger et al. | 357/74 |
| 4,920,454 | 4/1990 | Stopper et al. | 174/52.4 X |
| 5,008,614 | 4/1991 | Shreeve et al. | 174/52.4 X |
| 5,103,557 | 4/1992 | Leedy | 29/832 |
| 5,138,115 | 8/1992 | Lam | 174/52.4 |
| 5,210,485 | 5/1993 | Kreiger et al. | 29/846 X |
| 5,241,133 | 8/1993 | Mullen, III et al. | 174/52.4 |
| 5,304,738 | 4/1994 | Long | 174/52.4 |
| 5,338,899 | 8/1994 | Gainey | 174/52.4 |

*Primary Examiner*—Leo P. Picard
*Assistant Examiner*—Christopher Horgan
*Attorney, Agent, or Firm*—Baker & Botts

[57] ABSTRACT

Multi-chip module (MCM) (10) includes package body (12) having cavity (20) for accepting a plurality of devices and substrates and seal ring (26) to ensure the integrity of the package. Lead frame (18) having a plurality of individual leads (28) is coupled to the package body (12). Plurality of test points (38) or test pins (30) are located on the external surface of package body (12). A plurality of bond pads are located in cavity (20), including a first set or tier and a second set or tier of bond pads for electrically coupling the devices and substrates in the cavity (20) external to package body (12). The first set or tier of bond pads provides electrical connection between the individual devices in MCM (10) to plurality of test points (38) or test pins (30), and the second set or tier of bond pads provides electrical connection between the individual devices in MCM (10) and plurality of individual leads (28).

8 Claims, 2 Drawing Sheets

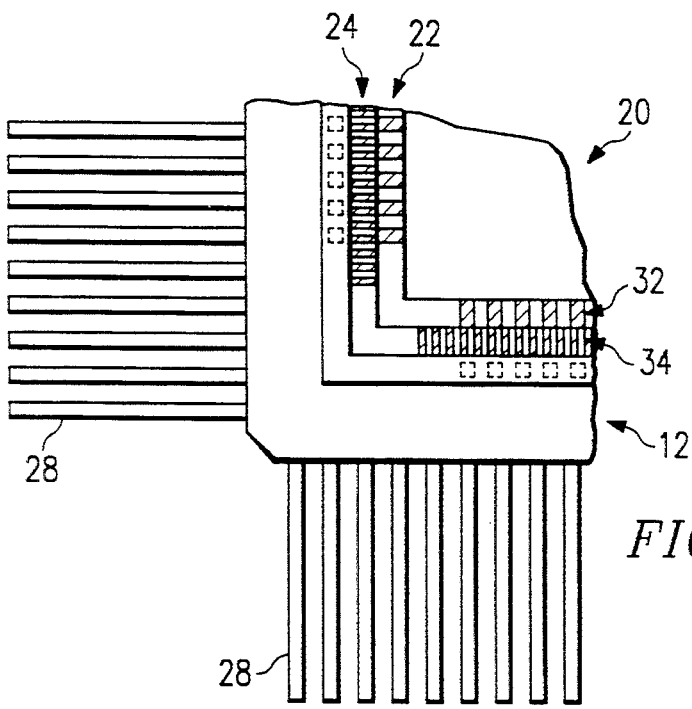
FIG. 2
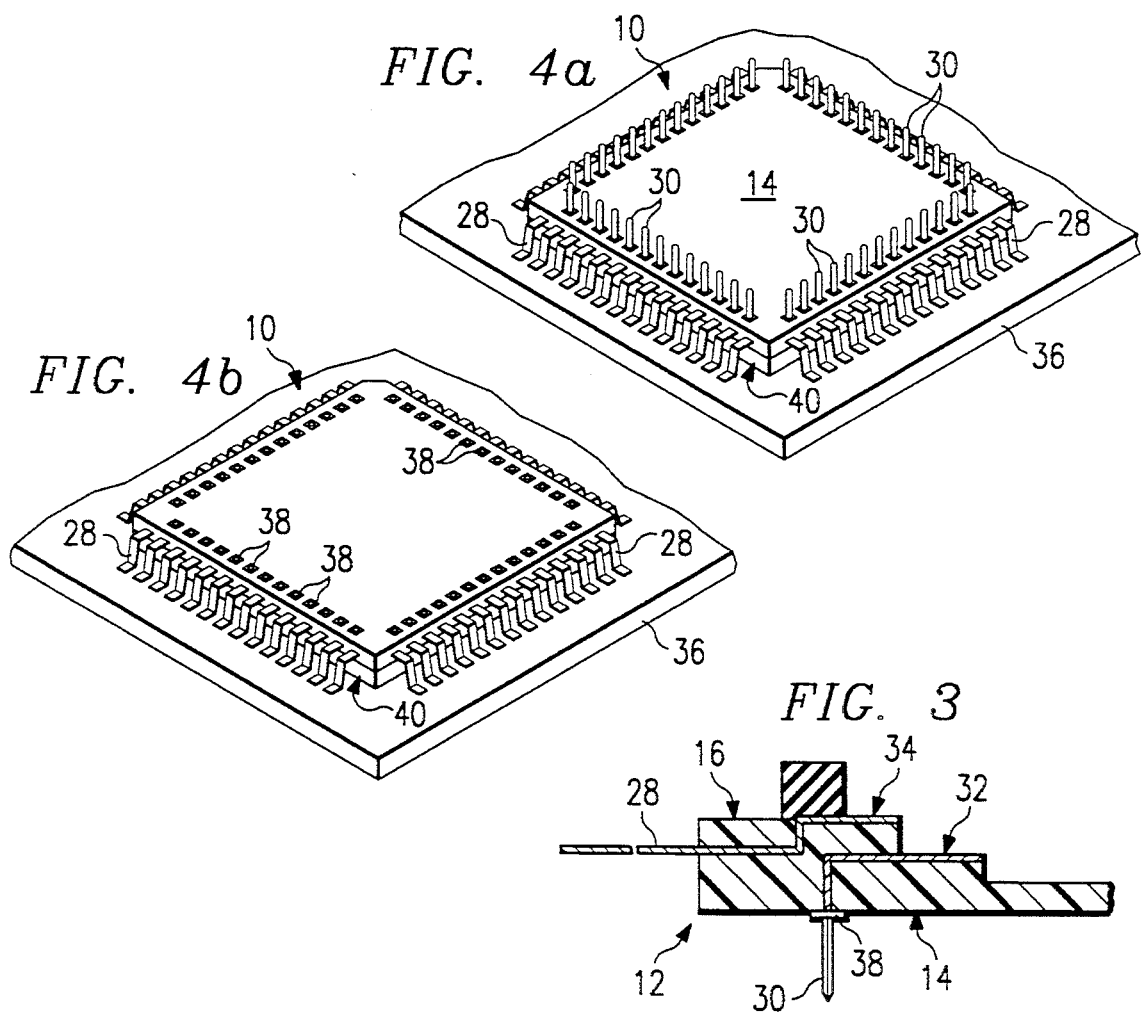
FIG. 4a
FIG. 4b
FIG. 3

METHOD AND APPARATUS FOR PROVIDING ELECTRICAL ACCESS TO DEVICES IN A MULTI-CHIP MODULE

TECHNICAL FIELD OF THE INVENTION

This invention relates in general to the field of electronic devices, and more particularly, to providing electrical access to devices in a multi-chip module (MCM). Even more specifically the present invention relates to a method and system for providing electrical access to a multi-chip module that includes test points or test pins that can be easily accessed external to the MCM packages without increasing the lead count or package size of the MCM package.

BACKGROUND OF THE INVENTION

As the complexity and density of semiconductor devices increases, the need for new packaging techniques has also arisen. A multi-chip module (MCM) containing multiple devices in a single package is one packaging approach. In an MCM, multiple semiconductor and passive devices are placed on substrate(s) in an MCM package. Sealing the MCM protects the devices within the MCM. This technique achieves a higher degree of device density than separately packaged semiconductor devices mounted on a printed circuit board. The higher density of MCM's translates to faster data processing times within the MCM. Additionally, locating all of the devices within a single MCM eliminates the need for driver circuits that would otherwise be required between the various devices. Using an MCM in turn reduces the chip count and power consumption required versus using individually packaged devices. The reduced chip count of an MCM also results in an increase in reliability of a system using MCMs over using discrete devices mounted to a printed circuit board.

While MCMs solve a number of design problems, they also give rise to a new set of problems. In particular, there are concerns with the testability and access to the individual devices in an MCM. Typically, only a portion of the inputs and outputs of the individual devices in an MCM have a direct connection to the leads of the MCM. Therefore, once an MCM is populated with various semiconductor and passive devices, testing the individual devices within the MCM is difficult. The small size of the individual devices in the MCM, coupled with the fact that not all of the inputs and outputs of the individual devices in an MCM can be connected to the input/output (I/O) pins of the MCM, denies access to the individual devices within the MCM. Thereby, making troubleshooting a malfunctioning MCM very difficult. In particular, determining the inoperable device(s) in an MCM can be very difficult.

Past approaches to solve this problem include a rigid incoming inspection system to ensure placing only good devices in the MCM. Unfortunately, a full functional test of a semiconductor die is often not possible. To fully exercise semiconductor die requires testing the die over the full temperature range of its application. Additionally, achieving a good electrical contact to the bond pads of a die by test probe is difficult. This prevents the necessary testing at incoming inspection, and particularly denies testing at the full speed and over the full temperature range of the individual devices in their application in the MCM.

Once an individual device slips through incoming inspection and is placed in the MCM, the time to isolate a die, if possible at all, and the time necessary to remove and replace a bad die is very expensive and time consuming. Troubleshooting an unsealed malfunctioning MCM includes testing with electrical probes. In this approach, a test probe is used to electrically access a suspected bad device in the MCM. Disadvantages of this method include the small size of the individual devices in the MCM, the relative size of the probe in relation to the bond pads of the individual devices, the density of the devices in the MCM, the likelihood of causing damage with a misplaced probe, and the inability to fully exercise an individual device with electrical test probes. For example, to fully test a microprocessor in an MCM requires sufficient number of test probes for both data and address bus lines in the microprocessor.

For modern microprocessors the number of probes that would be required will not physically fit into the MCM cavity. Additionally, the inability to fully test individual devices mounted within the MCM results in a reiterative process of removing suspected devices and retesting the MCM until all faults are removed. A trial and error remove and replace methodology for the individual devices in a malfunctioning MCM leads to unnecessary removal of good parts and possible damage, if not destruction, to the MCM in total. This process is very time consuming and expensive without providing acceptable results. Sealing the MCM with its lid denies even probe access to the individual devices in the MCM.

It is an object of the present invention, therefore to provide an improved method and apparatus for providing electrical access to the individual devices in an MCM without increasing the lead count or package size of the MCM package. A technical advantage of the present invention is that the MCM package includes test points and/or test pins which can be easily accessed externally to the package of the MCM by either a test probe or a test socket. The test pins and test points work in combination with the leads of the MCM package to provide greater electrical access to the individual devices within the MCM.

It is a further object of the present invention to provide an apparatus and method using the improved MCM package to allow for better troubleshooting of MCMs both before and after they are sealed, and allowing for software emulation on and programming or reprogramming of devices in the MCM.

BRIEF DESCRIPTION OF THE DRAWINGS

Other objects and advantages of the present invention will be apparent from the reading of the specification and appended claims in conjunction with drawings, wherein:

FIG. 2 depicts the detail of the area as identified in FIG. 1;

FIG. 3 depicts a cross-sectional view of multi-chip module package as identified in FIG. 1; and FIGS. 4a and 4b depict perspective views of circuit implementations of the preferred embodiments.

DETAILED DESCRIPTION OF THE INVENTION

Figure 1:
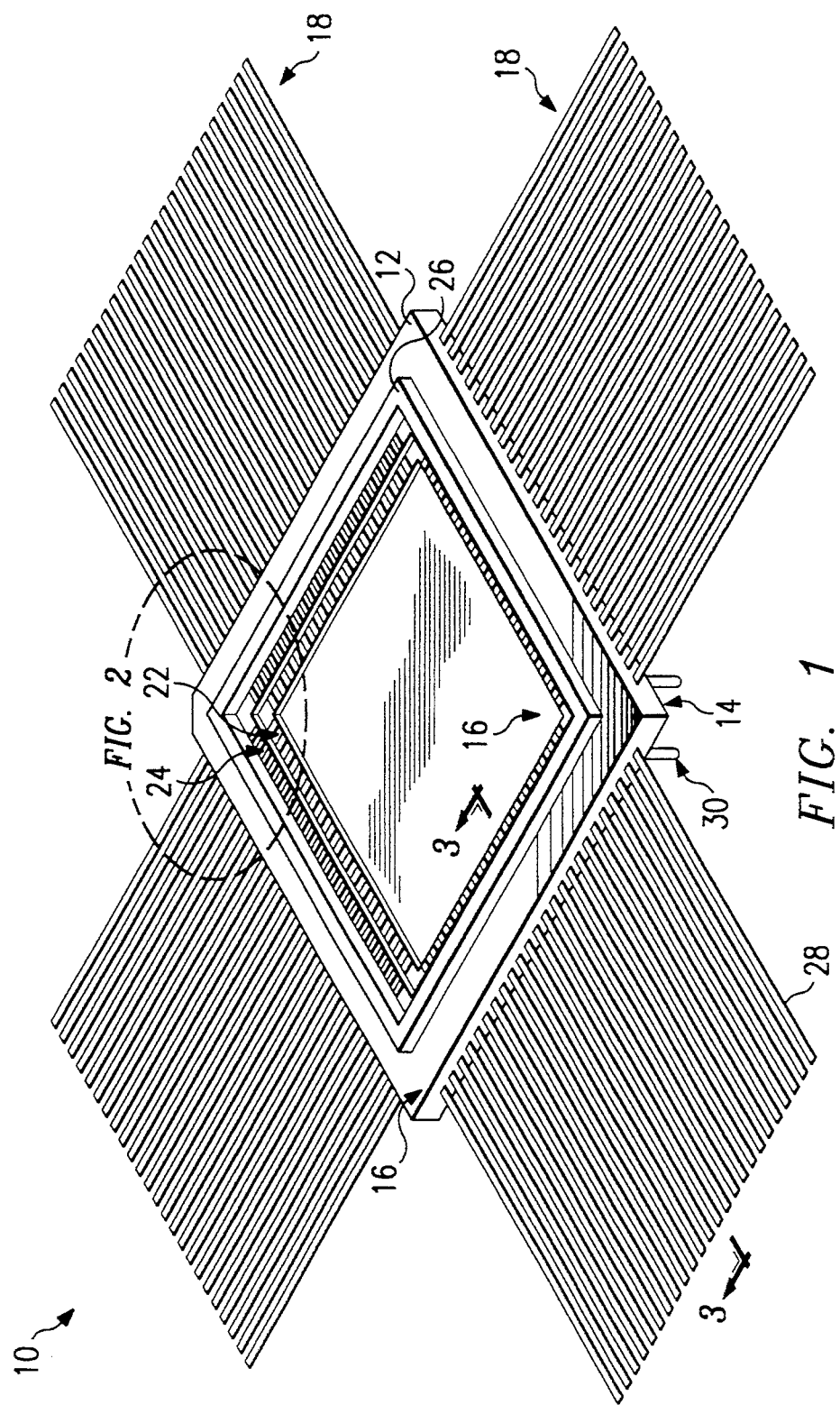
FIG. 1 provides a perspective view looking into the cavity of the multi-chip module package.

In FIG. 1, is shown a simplified view looking down into multi-chip module (MCM) 10. MCM 10 includes package body 12 with top surface 14, bottom surface 16, and lead frame 18. Package body 12 includes cavity 20, two sets of bond pads, including test pin bond pad set 22 and package input and output (I/O) bond pad set 24. Package body 12 also includes seal ring 26, and individual leads 28 in lead frame 18. Test pins 30 may be flush with or protrude from top surface 14. Alternatively, test pins 30 may protrude from bottom surface 16 in the event that cavity 20 is mounted from the upward side.

FIG. 2 depicts one possible top surface 14 or bottom surface 16 (bottom if package is mount cavity up) embodiment for the sets of bond pads. The sets of bond pads may be arranged where test pin bond pad layer 22 is located separately from package I/O bond pad layer 24. Test pin bond pad set 22 includes individual bond pads 32, and package I/O bond pad set 24 includes individual bond pads 34. This arrangement can be reversed without affecting the inventive concept of the present invention. Additionally, the sets of bond pads may all be located on the same level.

FIG. 3 depicts a cross-sectional view of MCM 10 showing the orientation of individual leads 28, package body 12, package I/O bond bad layered 39, test pin bond pad layer 32, and top 14 and bottom 16 surfaces of MCM 10. Individual bond pads 34 for package I/O bond pad set 24 are electrically coupled to leads 28 of MCM 10. Individual bond pads 32 for test pin bond pad set 22 are electrically coupled to test pins 30 and test points 38.

Referring again to FIG. 1, individual devices (not shown) of MCM 10 may be electrically connected by appropriate bond wires to individual bond pads 32 of test pin bond pad set 22 or individual bond pads 34 of I/O bond pad set 24 as is desired to provide electrical access to the devices in MCM 10. When MCM 10 is sealed, a lid is placed over cavity 20 and a seal is made with seal ring 26.

Once the individual devices are placed in MCM 10 and bonded to the appropriate bond pads, MCM 10 can be tested at the module level through individual leads 28 of MCM 10. If MCM 10 is found to be non-functional, knowing how individual devices are connected to leads 28 and test pins 30 of MCM 10 allows the individual devices in MCM 10 to be tested. By appropriately connecting to individual leads 28 and test pins 30 of MCM 10, the individual devices are isolated allowing for determination of whether they are the cause of the non-functionality of MCM 10. Testing individual devices in MCM 10 by this method is possible prior to or after sealing MCM 10. By providing access to individual devices in MCM 10, isolation of malfunctioning devices within MCM 10 is possible without using the time-consuming and often damaging process of test probing individual devices. Additionally, once MCM 10 is sealed, whereas access to individual devices in MCM 10 by probe is lost, test pins 30 in combination with package leads 28 provide the necessary electrical access to the individual devices in MCM 10.

Additionally, the access methodology for MCM's depicted in these figures also provides for greater access for purposes other than troubleshooting once MCM 10 is sealed. For example, if MCM 10 contains a programmable device, by appropriately connecting the programming inputs of the programmable device to test pins 30 and leads 28 of MCM 10, it will be possible to program and/or reprogram the programmable device after MCM 10 is sealed. Also, in applications where MCM 10 contains a microprocessor, it may be desirable to test software to be run on the microprocessor. By using test pins 30 and leads 28 of MCM 10, a software designer can access the microprocessor in MCM 10 for software emulation.

Referring to FIG. 4a, when sealed MCM 10 is mounted to printed circuit board 36, cavity 20 side of MCM 10 is mounted face down onto the surface of printed circuit board 36. This results with the lid 40 as bottom surface 16 closest to printed circuit board 36 and top surface 14 the visible surface when looking down on the MCM 10. If, on the other hand, cavity 20 is mounted face-up, than the emulation and in-circuit test pads are placed on the bottom of the package.

Test access, software emulation, and reprogramming of programmable devices in MCM 10 remain available. By using appropriate test pins 30 and package leads 28 individual devices can be accessed, even after MCM 10 is mounted to printed circuit board 36. Test pins 30 may be embodied in pin grid array (PGA) type pins as depicted in FIG. 4a. Test pins 30 are easily accessed by a clip or other socket mechanism. In an alternate embodiment shown in FIG. 4b, test pins 30 are test points 38 which are either flush with or slightly extending from package body 12 top surface 14.

For example, FIGS. 4a and 4b depict two embodiments of the present invention and demonstrate some of their technical advantages. Because test points 38 or test pins 30 have been included in MCM 10 package body 12, it is possible to troubleshoot, perform software emulation upon, or reprogram individual devices in MCM 10 even after it has been mounted onto printed circuit board 36. Access to individual devices in MCM 10 is accomplished without increasing the size of package body 12 or the number of leads 28.

The package material for MCM package body 12 can be ceramic, plastic, laminate, or metal. Additionally, test points 38 or test pins 30 can be located throughout the body of MCM package body 12, and do not have to be located along a peripheral ring of package body 12.

Other embodiments of the present invention that may not have been discussed here in detail can be easily identified.

OPERATION

The basic operation of the preferred embodiment is very straightforward once conceived and comprises, for example, placing individual devices within the cavity 20 of MCM 10 package body 12. By appropriately electrically connecting individual devices within cavity 20 by bond wires to the bond pads of test pin bond pad layer 22 or package I/O bond pad layer 24 the present embodiment provides the desired functionality at leads 28 of MCM 10 and the desired access to individual devices within MCM 10 at test points 38 or test pins 30. The improved access is available before MCM 10 is sealed, after sealing, and even after the placing MCM 10 on printed circuit board 36. This allows easier troubleshooting of MCM 10, software test emulation, and programming changes to the devices in MCM 10 even after sealing MCM 10.

In summary, we have illustrated one embodiment of the inventive concept of the multi-chip module package with additional test points. The multi-chip module package includes a package body having a cavity for accepting a plurality of micro-electronic devices and substrates and a seal ring to ensure the integrity of the package. A lead frame having a plurality of leads is coupled to the package body and a plurality of test points are located on the external surface of the package body. Alternatively, package input and output may be an integral part of the package. This would not require use of the leadframe. A plurality of bond pads are located in the cavity of the package including a first set or tier and second set or tier of bond pads for electrically coupling the devices and substrates in the cavity external to the package body. The first set or tier of bond pads are electrically coupled to the plurality of test points and the second set or tier of bond pads are electrically coupled to the plurality of leads.

As a result of the above, although the invention has been described with reference to the above embodiments, its description is not meant to be construed in a limiting sense. Various modifications of the disclosed preferred embodiment, as well as the alternative embodiments of the invention may make further embodiments apparent to persons skilled in the art upon reference to the above description. It is, therefore, contemplated that the appended claims will cover such modifications that will fall within the true scope of the invention.

What is claimed is:

1. A multi-chip module package for providing electrical access to the individual devices in the multi-chip module without increasing the lead count or package size of the multi-chip module package, the multi-chip module package comprising:
   a package body having a cavity for accepting a plurality of devices and substrates;
   a lead-frame having a plurality of leads coupled to said package body;
   a plurality of test points located on an external surface of said package body; and
   a plurality of bond pads in said cavity, including a first set and a second set of bond pads, for electrically coupling the devices and substrates in said cavity external to said package body, said first set of bond pads being electrically coupled to said plurality of test points, and said second set of bond pads being electrically coupled to said plurality of leads.

2. A method for providing electrical access to the individual devices in a multi-chip module package without increasing the lead count or package size of the multi-chip module package, comprising the steps of:
   locating a plurality of devices and substrates in a package body having a cavity;
   coupling a lead-frame having a plurality of leads to the package body;
   providing a plurality of test points located on an external surface of the package body;
   providing a plurality of bond pads in said cavity, including a first set and a second set of bond pads, for electrically coupling the devices and substrates in the cavity external to the package body; and
   electrically coupling the first set of bond pads to the plurality of test points and the second set of bond pads to the plurality of leads.

3. A printed circuit board assembly having a multi-chip module package coupled thereto, the multi-chip module package provides electrical access to the individual devices in the multi-chip module without increasing the lead count or package size of the multi-chip module package, the printed circuit board assembly comprising:
   a printed circuit board for associating with at least one multi-chip module; and
   a multi-chip module package comprising:
   a package body having a cavity for accepting a plurality of devices and substrates;
   a lead-frame having a plurality of leads coupled to said package body;
   a plurality of test pins located on an external surface of said package body; and
   a plurality of bond pads in said cavity, including a first set and a second set of bond pads, for electrically coupling the devices and substrates in said cavity external to said package body, said first set of bond pads are electrically coupled to said plurality of test pins, and said second set of bond pads are electrically coupled to said plurality of leads.

4. A method for providing electrical access to the individual electronic devices in a multi-chip module package on a printed circuit board without increasing the lead count or package size of the multi-chip module package, comprising the steps of:
   locating a multi-chip module package body having a cavity on a printed circuit board;
   locating a plurality of devices and substrates in the package body of the multi-chip module;
   coupling a lead-frame having a plurality of leads to the package body;
   providing a plurality of test pins located on the external surface of the package body;
   providing a plurality of bond pads in the cavity, including a first set and a second set of bond pads, for electrically coupling the devices and substrates in the cavity external to the package body; and
   electrically coupling the first set of bond pads to the plurality of test pins and the second set of bond pads to the plurality of leads.

5. A multi-chip module containing a plurality of devices and substrates, comprising:
   a package body formed to accept a plurality of devices and substrates;
   a lead-frame having a plurality of leads formed to associate with said package body;
   test means associated with the external surface of said package body; and
   a first and a second electrically coupling means for electrically coupling said devices and substrates external to said package body, said first coupling means being electrically coupled to said test means, and said second coupling means being electrically coupled to said plurality of leads.

6. A method for electrically accessing individual devices within a multi-chip module, comprising the steps of:
   assembling a plurality of devices into a multi-chip module package body;
   coupling a plurality of leads to the multi-chip module package body;
   forming a plurality of test pins on an external surface of the multi-chip module package body;
   forming a plurality of bond pads in the cavity of the multi-chip module, including a first set and a second set of bond pads, to electrically couple the devices external to the module package body;
   electrically coupling the devices to said plurality of bond pads; and
   electrically coupling the first set of bond pads to the plurality of test pins and the second set of bond pads to the plurality of leads.

7. The multi-chip module package of claim 1 wherein said plurality of test points further comprises a plurality of test pins extending from said external surface of said package body.

8. The multi-chip module package of claim 1 wherein said plurality of test points are substantially flush with said external surface of said package body.

* * * * *